United States Patent [19]

Freeouf et al.

[11] 4,426,237
[45] Jan. 17, 1984

[54] VOLATILE METAL OXIDE SUPPRESSION IN MOLECULAR BEAM EPITAXY SYSTEMS

[75] Inventors: John L. Freeouf, Peekskill, N.Y.; Peter D. Kirchner, State College, Pa.; George D. Pettit, Mahopac; Jerry M. Woodall, Bedford Hills, both of N.Y.

[73] Assignee: International Business Machines Corporation, Armonk, N.Y.

[21] Appl. No.: 311,091

[22] Filed: Oct. 13, 1981

[51] Int. Cl.$^3$ .................. H01L 21/203; H01L 21/363
[52] U.S. Cl. .................................... 148/175; 118/724; 118/726; 118/727; 118/900; 148/1.5; 148/174; 156/611; 156/612; 156/DIG. 70.DIG. 103; 427/87; 427/294
[58] Field of Search ....................... 148/1.5, 174, 175; 427/86, 87, 294; 156/610, 611, 612, DIG. 103, DIG. 70; 118/724, 726, 727, 50.1, 900

[56] References Cited

U.S. PATENT DOCUMENTS

| | | | |
|---|---|---|---|
| 3,615,931 | 10/1971 | Arthur et al. | 148/175 |
| 3,647,389 | 3/1972 | Weiner | 148/1.5 X |
| 3,839,084 | 10/1974 | Cho et al. | 148/175 X |
| 3,974,002 | 8/1976 | Casey et al. | 148/175 |
| 4,159,919 | 7/1979 | McFee et al. | 156/610 X |
| 4,239,584 | 12/1980 | Chang et al. | 427/86 X |

OTHER PUBLICATIONS

Chang et al., "Source Shaping ... by Molecular Beam Epitaxy", I.B.M. Tech. Discl. Bull., vol. 15, No. 1, Jun. 1972, pp. 180–181.
Chang et al., "Fabrication for Multilayer Semiconductor Devices", Ibid, vol. 15, No. 2, Jul. 1972, pp. 365–366.
Ludeke et al., "Fabrication for a Tunable ... Injection Laser", Ibid., vol. 15, No. 2, Jul. 1972, pp. 546–547.
R. A. Stall, et al., Electron. Letter 16 (5), pp. 171–172, (1980).
T. A. Murotani, et al., Journal of Crystal Growth, 45, pp. 302–308, (1978).
A. Y. Cho, et al., Journal of Appl. Physics, 43 (12), pp. 5118–5123, (1972).
C. N. Cochran, et al., Journal of Electrochemical Soc., 109, No. 2, Feb. 1962, pp. 144–148, "Vapor Pressure of Gallium, Stability of Gallium Suboxide Vapor, and Equilibria of Some Reactions ... ".

Primary Examiner—W. G. Saba
Attorney, Agent, or Firm—Yen S. Yee

[57] ABSTRACT

When growing GaAs by molecular beam epitaxy (MBE), a typical related reaction acts to affix $Ga_2O_3$ to the growth surface and hence incorporates such oxide contaminants in the epitaxial layer as it is grown. Such contaminants may yield crystals of poor electrical and optical properties. When Al is added to the Ga source crucible, the $Ga_2O$ flux is reduced substantially thereby suppressing the formation of such oxide contaminants and remove a serious constraint to MBE growth. When doping GaAs with Mg to form a p-type GaAs layer, unity Mg doping efficiency is achieved by including 0.1% Al in the Ga effusion cell. Such an inclusion of Al improves the Mg doping efficiency by suppressing the formation of MgO, and allows MBE growth at lower substrate temperatures and at higher growth rates.

10 Claims, 5 Drawing Figures

FIG. 1
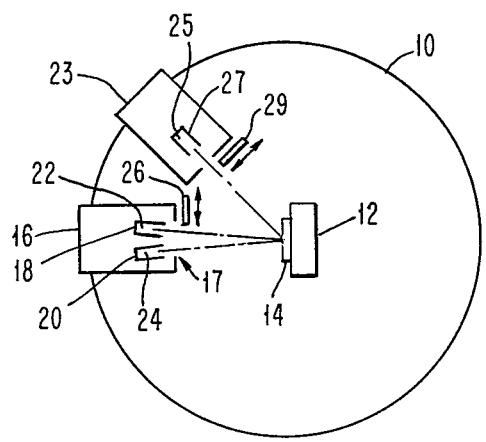
FIG. 1.1
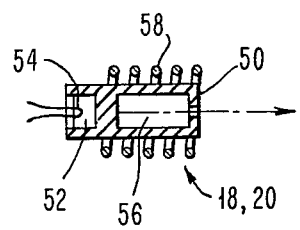
FIG. 4
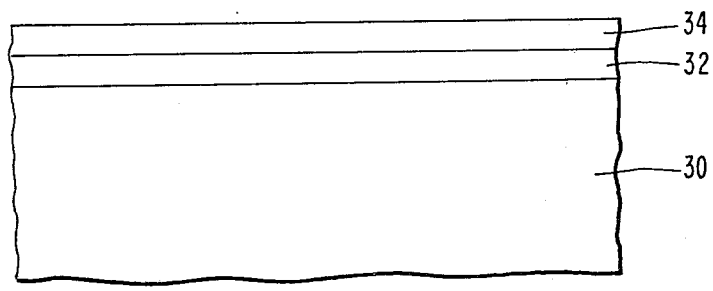

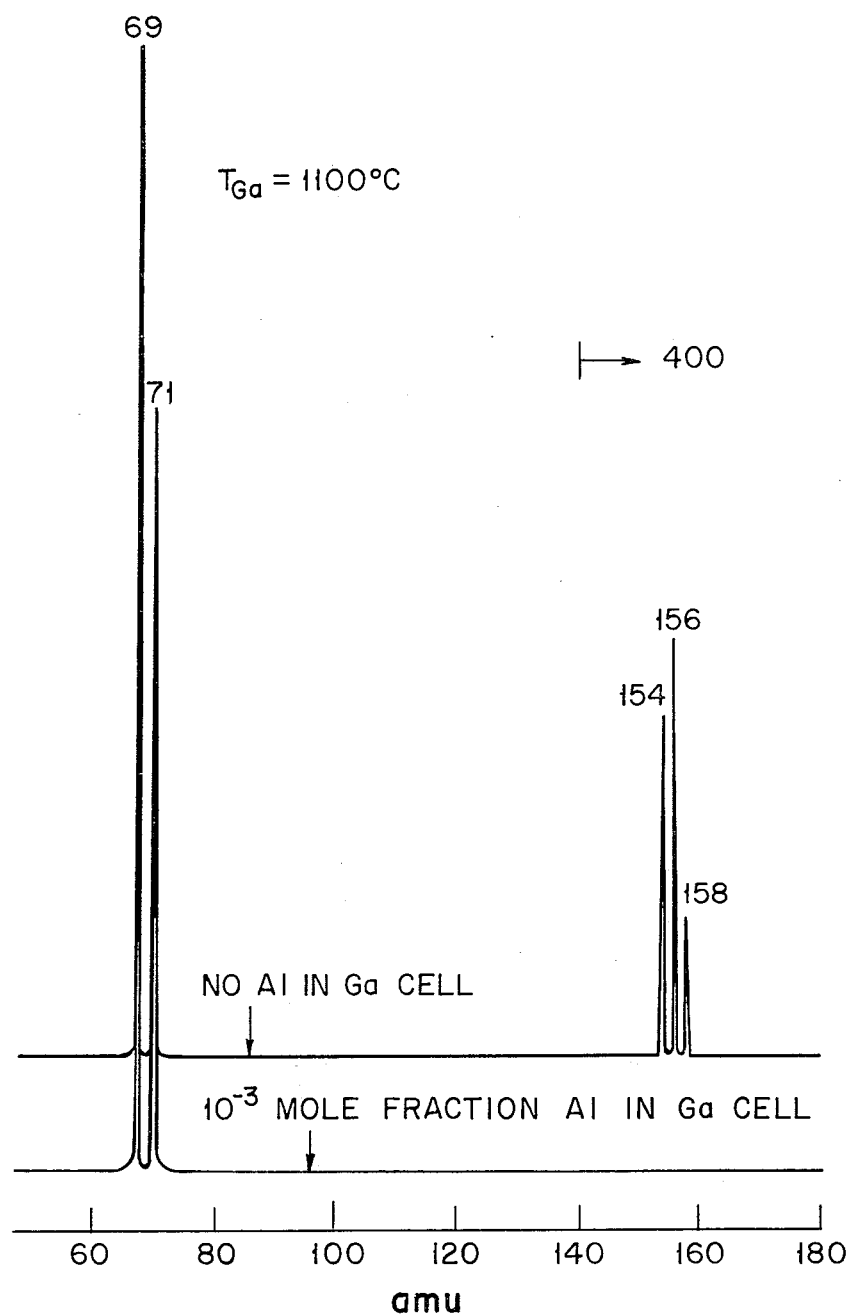

VOLATILE METAL OXIDE SUPPRESSION IN MOLECULAR BEAM EPITAXY SYSTEMS

DESCRIPTION

Technical Field

This invention relates generally to the growing of a material layer by molecular beam epitaxy (MBE), and more particularly to the suppression of volatile metal oxide in MBE growth.

BACKGROUND ART

Recent interest in molecular beam epitaxy (MBE) stems from the recognition that MBE permits the fabrication of thin epitaxial layers with great uniformity over a large surface area, and with precision control of the layer thickness. Conventional techniques and apparatus for epitaxial growth of thin films of semiconductor materials by MBE techniques are known.

In U.S. Pat. No. 3,615,931 to J. R. Arthur, Jr. (1971), there is described an MBE technique in which growth of a thin film results from the simultaneous impingement of one or more molecular beams of the constituent elements onto a heated substrate. Furthermore, MBE techniques for making a group III(a)-V(a) p-type thin film by doping with magnesium have also become known. For example, one such technique is described in U.S. Pat. No. 3,839,084 to A. Y. Cho, et al. However, the MBE growth of such p-type layer is constrained by the low doping efficiency of Mg, more of which will be described hereinafter.

Notwithstanding the important advances in MBE, the growing of GaAS and $Ga_{1-x}Al_xAs$ by molecular beam epitaxy at both low substrate temperature and high growth rates, especially under high arsenic pressures, yields crystal of poor electrical and optical properties. These results have been reported, for example, by R. A. Stall, et al, Electron. Letter 16 (5), pp. 171–2, (1980), and by T. A. Murotani, et al, Journal of Crystal Growth, 45, pp. 302–08 (1978).

MBE growth is also subjected to many parametric constraints. For instance, the minimum substrate temperature to form good to high quality GaAs is about 550° C. as reported by A. Y. Cho, et al, Journal of Applied Physics, 43 (12), pp. 5118–5123 (1972). For $Ga_{1-x}Al_xAs$ with $x>0.1$, the substrate must be maintained at 650° to 700° C. MBE growth rates are limited to about one micron-per-hour, with the best V–III flux ratios at about two-to-one.

In the fabrication of AlGaAs layers, it is recognized as important to reduce as much as possible the amount of deleterious contaminants. For instance, in U.S. Pat. No. 3,974,002 to H. C. Casey, Jr., et al, it is stated that deleterious contaminants, e.g., $H_2O$, $CO$, $O_2$, and hydrocarbons are reduced as much as possible by utilizing pyrolytic boron nitride rather than graphite, effusion cells. Also described is a technique using relatively uncollimated beams so that a portion of the beams deposits continuously on the interior walls of the vacuum chamber fresh layers which getter the deleterious contaminants.

$Ga_2O$ has become known as a deleterious contaminant. For instance, in an article entitled, "Vapor Pressure of Gallium, Stability of Gallium Suboxide Vapor, and Equilibria of Some Reactions Producing Gallium Suboxide Vapor", by C. N. Cochran et al, Journal of Electrochemical Society, 109, No. 2, February 1962, pp. 144–148, the authors showed in essence that volatile $Ga_2O$ is present and requires consideration in chemical reactions involving gallium.

As referred to above, one of the difficulties encountered in MBE growth is the low doping efficiency of magnesium as described by A. Y. Cho, et al, Journal of Applied Physics 43 (12), pp. 5118–5123 (1972). More specifically, the sticking coefficient (doping efficiency) of magnesium is described by A. Y. Cho, et al, in U.S. Pat. No. 3,839,084 as a non-linear, monotonically increasing function of the amount of aluminum in the MBE growth of Mg doped p-type thin film compound of $Al_xGa_{1-x}As$. According to the Cho, et al, patent, the sticking coefficient of Mg can be varied by controlling the intensity of the Al beam (i.e., the Al arrival rate). As a result, for a given carrier concentration in the layer grown, a lower Mg beam flux may be used by increasing the amount of Al in the layer, i.e., by increasing the intensity of the Al beam.

DISCLOSURE OF INVENTION

When growing materials by molecular beam epitaxy (MBE) such as GaAs, a typical related reaction acts to affix oxygen atoms in a nonvolatile form to the growth surface, and hence incorporates such oxygen atoms in the epitaxial layer as it is grown.

In the case of GaAs, one of the major contributors of oxygen is the gallium source. Gallium typically has a large amount of oxygen in the form of $Ga_2O_3$, which at elevated temperatures reacts with gallium to form $Ga_2O$. The presence of $Ga_2O$ represents a major contaminant and poses a serious constraint to MBE growth. Such contaminants may yield crystals of poor electrical and optical properties.

When aluminum, or other non-doping oxygen gettering material whose oxide's vapor pressure is low, is added to the Ga source crucible, the relative amount of aluminum effused is low and is insignificant to the grown layer composition but the effect upon the oxide concentration is drastic. The resulting reaction favors the nonvolatile $Al_2O_3$ by $\sim 32/K$ cal per mole. As a result the $Ga_2O$ flux is reduced by at least 1000:1 thereby virtually eliminating $Ga_2O$ as a contaminant or as a serious constraint to MBE growth.

When doping GaAs with magnesium to form a p-type GaAs layer, an improvement of magnesium doping efficiency from about $10^{-5}$ to essentially unity is achieved by including 0.1% aluminum in the gallium effusion cell. Such an inclusion of aluminum improves the Mg doping efficiency by suppressing the formation of MgO, and allows MBE growth at lower substrate temperatures and at higher growth rates.

The foregoing features and advantages of this invention will be apparent from the following more particular description of the best mode for carrying out the invention, as illustrated in the accompanying drawings.

BRIEF DESCRIPTION OF DRAWINGS

The details of the present invention will be described in connection with the accompanying drawings, in which:

FIG. 1 is a schematic of the MBE system used in carrying out the present invention.

FIG. 1.1 is a more detailed diagram of the effusion cell used in the MBE system illustrated in FIG. 1.

FIG. 3 illustrates the mass spectrum versus atomic mass unit (amu) of Ga effusion cell at about 1100° C. before and after the addition of Al. A 400X intensity scale change is in effect for the region in which amu>140.

FIG. 4 illustrates a GaAs PN junction having a p-type GaAs layer grown in accordance with the teachings of the present invention.

BEST MODE FOR CARRYING OUT THE INVENTION

Figure 2:
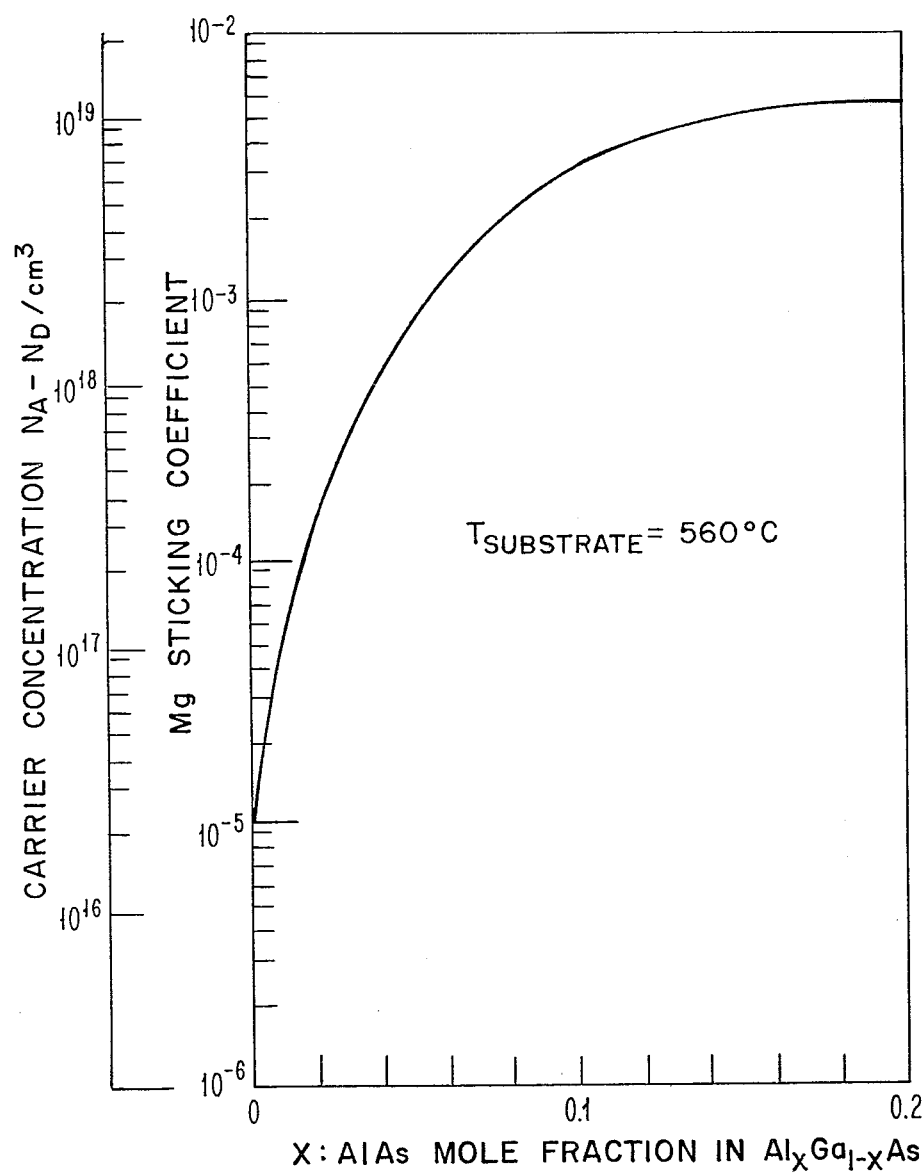
FIG. 2 shows the prior reported low doping efficiency difficulty of doping GaAs with Mg.

Referring to FIG. 1, there is shown in a simplified diagram the major components of an MBE apparatus for growing epitaxial films of Group III(a)-V(a) compounds.

MBE apparatus of this type are known. For instance, U.S. Pat. No. 3,974,002 to H. C. Casey, Jr., et al, describes in some details such a system. The MBE apparatus, such as the one shown in FIG. 1, comprises a vacuum chamber 10 containing therein cylindrical guns, typically Knudsen effusion cells 18 and 20, thermally insulated from one another by wrapping each cell 18 and 20 with a heat shielding material not shown. Effusion cells 18 and 20 are disposed within cylindrical liquid nitrogen cooling shroud 16 which has a collimating aperture 17. An MBE system may contain one or more cooling shroud. A movable shutter 26 is utilized to block aperture 17 at a preselected time when it is desired that a particular beam not impinge upon a substrate 14. Substrate 14 is attached and supported by substrate holder 12. The temperature of substrate 14 can be raised by a heater (not shown) attached thereto.

A typical effusion cell (FIG. 1.1) 18 or 20 comprises a refractory crucible 50 having a thermocouple well 52 and a thermocouple 54 inserted therein for monitoring the source materials 22 or 24 (FIG. 1) contained in the cell chamber 56. Source material 22 or 24 is contained in cell chamber 56 for vaporization by heating coil 58 which surrounds the crucible 50.

Referring to FIG. 4, a GaAs PN junction is fabricated according to the teachings of the present invention. GaAs substrate 30 is of the n-type and with, for example, a 100 orientation. Using conventional techniques, an n-type Si doped GaAs layer 32 is formed thereon substrate 30. To grow the p-type Mg doped GaAs layer 34, the structure comprising substrate 30 and n-type layer 32 is placed on substrate holder 14 in the MBE system shown in FIG. 1. The growth temperature of the structure is set and maintained at about 550° C. at a vacuum of about $10^{-9}$ Torr.

Effusion cell 18 (FIG. 1) containing within its crucible 50 a source material 22 works as a Ga source. According to the present invention, source material 22 includes Al, more specifically, with a $10^{-3}$ mole Al/mole Ga composition. The Ga source effusion cell 18 is heated to and maintained at a temperature of about 1110° C. to produce a molecular beam with an arrival rate which results in a growth rate of about 0.75 micron per hour of GaAs at the growth surface of the structure placed on substrate holder 14. Similarly, effusion cell 20 containing within its crucible a source material 24 works as an As source. According to the present invention, source material 24 includes Al, more specifically, with a $10^{-3}$ mole Al/mole GaAs composition. The As source effusion cell 20 is heated to and maintained at a temperature of about 1053° C. to produce a molecular beam with a desired flux ratio of As$_2$/Ga of about 1 to 1.

Effusion cell 27 (FIG. 1) containing within its crucible Mg 25 which works as a Mg source. This Mg source 25 is heated to and maintained at a temperature of about 277° C. to produce an energy beam sufficient to provide a doping concentration level of about $2 \times 10^{19}$ atoms per cc, assuming unity doping efficiency.

For MBE growth of the p-type Mg doped GaAs layer 34, shutters 26 and 29 (FIG. 1) are opened for a duration of about 180 minutes so as to allow the three molecular beams to converge on the structure held on holder 14. The resulting p-type layer 34 has a thickness of about 2.1 micron, and is formed on top of the n-type layer 32 so as to complete the GaAs PN junction illustrated in FIG. 4.

Hall measurements of the p-type GaAs layer 34 according to the present invention give a free carrier density of about $1.3 \times 10^{19}$ cm$^{-3}$ at room temperature, and a hole mobility of 72 cm$^2$V$^{-1}$S$^{-1}$. These measurement results together with Nomarski microscopy indicate that the p-type Mg doped GaAs crystal grown in accordance with the teachings of the present invention have excellent morphology and good electrical and optical characteristics. Mass spectrometry and Hall effect measurement results also show that the Mg was incorporated and doped at approximately unity efficiency.

When growing materials, such as GaAs, using an MBE apparatus shown in FIG. 1, a typical related reaction

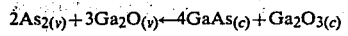
$$2As_{2(v)} + 3Ga_2O_{(v)} \leftarrow 4GaAs_{(c)} + Ga_2O_{3(c)}$$

or any number of parallel reactions act to affix the oxygen in a nonvolatile form to the growth surface, and hence incorporate it in the epitaxial layer as it is grown.

In the case of GaAs, one of the major contributors of oxygen is the gallium source. Gallium typically has a large amount of oxygen in the form of Ga$_2$O$_3$, which at elevated temperatures reacts with gallium to form Ga$_2$O. The presence of Ga$_2$O represents a major contaminant and poses a serious constraint to MBE growth. Such contaminants may yield crystals of poor electrical and optical properties.

According to one aspect of the present invention, when aluminum, or other materials having an affinity for oxygen, i.e., other non-doping oxygen gettering material whose oxide's vapor pressure is low, is added to the Ga source crucible 50, the relative amount of aluminum effused is low and is insignificant to the grown layer composition but the effect upon the oxide concentration is drastic. For example, the reaction

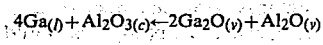
$$4Ga_{(l)} + Al_2O_{3(c)} \leftarrow 2Ga_2O_{(v)} + Al_2O_{(v)}$$

favors the nonvolatile Al$_2$O$_3$ by ~32/K cal per mole. As a result the Ga$_2$O flux is reduced by at least 1000:1 thereby virtually eliminating Ga$_2$O as a contaminant or as a serious constraint to MBE growth.

FIG. 3 shows the Ga cell's mass spectrum before and after the addition of Al. The doublet 69 and 71 signifies the presence of the two isotopes of gallium. Before the inclusion of Al, the Ga$_2$O triplet 154, 156 and 158 was a major feature of the mass spectrum. With the inclusion of Al, the Ga$_2$O and Al$_2$O peaks are indiscernable, not even when the intensity scale for the region beyond 140 atomic mass units (amu) has been incremented by 400 times. Aluminum "contamination" of the GaAs layer 34 is also hardly a problem: at about $10^{-4}$ below the Ga flux, the effects of Al upon the characteristics of the layer 34 are insignificant.

When doping GaAs with Mg by MBE, the prior difficulty of low doping efficiency of Mg (as described hereinabove) as shown in FIG. 2 was experienced. According to another aspect of the present invention, when doping GaAs with magnesium to form a p-type GaAs layer, the equation:

$$2GaAs_{(c)}+MgO_{(c)} \leftarrow Ga_2O_{(v)}+Mg_{(v)}+As_{2(v)}$$

applies. An improvement of magnesium doping efficiency from approximately $10^{-5}$ (FIG. 2) to essentially unity is achieved by including 0.1% aluminum in the gallium effusion cell. Such an inclusion of aluminum improves the Mg doping efficiency by suppressing the formation of MgO, and allows MBE growth at lower substrate temperatures and at higher growth rates.

Although volatile metal oxide suppression in molecular beam epitaxy system is shown and described in conjunction with forming a p-type Mg doped GaAs layer in the fabrication of the GaAs PN junction illustrated in FIG. 4, the invention as shown and described hereinabove is applicable generally for fabricating other devices, and in conjunction with other Group III-V compounds grown by MBE. Furthermore, although volatile metal oxide suppression is shown and described in the context of a molecular beam source for an MBE system, it is clear to one of ordinary skill in this art that substantially contaminant-free molecular beam sources in accordance with the teachings of the present invention may be adapted as evaporant sources in widely used metal thin film evaporation systems.

Although aluminum is described to be added to the source element in the crucible to suppress the inherent contaminant present in the source element, other materials having an affinity for such contaminant may also be suitable. In particular, a non-doping oxygen gettering material having a low oxide vapor pressure similar to aluminum may also be suitable.

From the preceding detailed description of applicants' invention, it is seen that metal oxide suppression in MBE systems in accordance with the present invention has advantages heretofore not possible to achieve. In addition to the variation and modification of applicants' disclosed apparatus which have been suggested, many other variations and modifications will be apparent to those skilled in the art, and accordingly the scope of applicants' invention is not to be construed to be limited to the particular embodiments shown or suggested.

Having thus described our invention, what we claim as new, and desire to secure by Letters Patent is:

1. In a molecular beam source for providing a molecular beam, wherein said source contains a source material having an inherent contaminant, the improvement comprising the addition in said source a second material having an affinity for said contaminant, said second material has the property that upon heating said second material combines with said contaminant thereby providing a molecular beam of said source material, said molecular beam being substantially free of both said contaminant and said second material.

2. In a molecular beam source as set forth in claim 1 wherein said second material is a non-doping oxygen gettering material having a low oxide vapor pressure.

3. In a molecular beam source as set forth in claim 2 wherein said oxygen gettering material is aluminum.

4. In a molecular beam source as set forth in claim 3 wherein said source material is a Group III(a)-V(a) compound.

5. In a molecular beam source as set forth in claim 3 wherein said source material is gallium.

6. In fabricating a magnesium doped p-type Group III(a)-V(a) layer by molecular beam epitaxy apparatus of the type wherein a source material is vaporized within a crucible to form a molecular beam which converges on a substrate to form said p-type Group III(a)-V(a) layer, the improvement of the magnesium doping efficiency to unity comprising the addition in said crucible a second material having an affinity for a contaminant introduced by said source material thereby providing a molecular beam of said source material, said molecular beam being substantially free of both said contaminant, and said second material.

7. In fabricating a magnesium doped p-type Group III(a)-V(a) layer as set forth in claim 6 wherein said second material is a non-doping oxygen gettering material having a low oxide vapor pressure.

8. In fabricating a magnesium doped p-type Group III(a)-V(a) layer as set forth in claim 7 wherein said oxygen gettering material is aluminum.

9. In fabricating a magnesium doped p-type Group III(a)-V(a) layer as set forth in claim 8 wherein said source material is gallium.

10. In fabricating a magnesium doped p-type Group III(a)-V(a) layer as set forth in claim 9 wherein said Group III(a)-V(a) layer is gallium arsenide.

* * * * *